(12) United States Patent
Sauer

(10) Patent No.: US 6,208,215 B1
(45) Date of Patent: Mar. 27, 2001

(54) VCO AND FILTER CONTROLLED BY COMMON INTEGRATED THERMAL FREQUENCY REFERENCE

(75) Inventor: Don Sauer, San Jose, CA (US)

(73) Assignee: National Semiconductor Corp., Santa Clara, CA (US)

( * ) Notice: Subject to any disclaimer, the term of this patent is extended or adjusted under 35 U.S.C. 154(b) by 0 days.

(21) Appl. No.: 09/421,795

(22) Filed: Oct. 20, 1999

Related U.S. Application Data

(63) Continuation-in-part of application No. 09/231,456, filed on Jan. 14, 1999.

(51) Int. Cl.$^7$ .................................................. H03B 5/12
(52) U.S. Cl. ........................ 331/108 C; 331/176; 324/711
(58) Field of Search .................................. 327/552, 553, 327/561; 331/132, 185, 177 R, 176, 66, 108 C; 330/85; 324/677, 711, 679, 681

(56) References Cited

U.S. PATENT DOCUMENTS

| | | | |
|---|---|---|---|
| 3,766,444 | 10/1973 | Bosch | 317/234 R |
| 3,792,367 | * 2/1974 | Fleischer | 330/98 |
| 3,851,276 | * 11/1974 | Kaplan | 331/108 D |
| 4,058,779 | 11/1977 | Fraley | 331/108 R |
| 4,661,785 | * 4/1987 | Benjaminson | 331/109 |
| 4,757,528 | 7/1988 | Falater et al. | 379/412 |
| 5,041,800 | 8/1991 | Long et al. | 331/69 |
| 5,343,170 | * 8/1994 | Lee | 331/132 |
| 5,396,188 | * 3/1995 | Aoki | 327/552 |
| 5,663,676 | * 9/1997 | Itoh | 327/553 |
| 5,697,082 | 12/1997 | Greer et al. | 455/255 |

OTHER PUBLICATIONS

Shanks, et al., *Thermal Conductivity of Silicon from 300 to 1400° K\**, Physical Review, vol. 130, No. 5, Jun. 1, 1963, pp. 1743–1748.

Louw, et al., *Inductor–Less, Capacitor–Less State–Variable Electrothermal Filters*, IEEE Journal of Solid–State Circu, May 1975, pp. 416–424.

Heasell, E.L., *The Heat–Flow Problem in Silicon: An Approach to an Analytical Solution with Application to the Calculation of Thermal Instability in Bipolar Devices*, IEEE Transaction on Electron Devices, vol. ED–25, No. 12, Dec. 1978, pp. 1382–1388.

\* cited by examiner

*Primary Examiner*—Robert Pascal
*Assistant Examiner*—Kimberly E Glenn
(74) *Attorney, Agent, or Firm*—Stallman & Pollock LL:

(57) ABSTRACT

A VCO and filter each include a variable transconductance amplifier as a resistive element. The same control bias current is supplied to the variable transconductance amplifier of both the oscillator and filter. This control bias current may be externally supplied, or may be generated on-chip from a thermal RC network formed from base-emitter junctions of bipolar transistors arrayed in single crystal silicon about a heat source. Application of a clock signal from the VCO to the heat source generates a heat pulse which propagates across the arrayed transistors. The resulting change in temperature produces a change in $V_{be}$ of the arrayed transistors. The phase shift between the original clock signal and the changed $V_{be}$ is determined solely by the time constant $\tau$ of the particular thermal RC network. This time constant is a function of the inherent stable thermal resistance and capacitance of the single crystal silicon, and of the location and relative spacing of the arrayed transistors. The time constant is independent of amplitude, frequency, and duty cycle of the original clock signal. The phase shift between the original clock signal and the time-delayed output of the thermal RC network is determined, and a bias control current corresponding to this phase shift is generated and fed back to the VCO and to the filter. A VCO having constant frequency output, and a filter having a bandwidth tied to the VCO frequency, can thus be self-contained on a chip without the need for an external frequency reference.

33 Claims, 11 Drawing Sheets

VCO AND FILTER CONTROLLED BY COMMON INTEGRATED THERMAL FREQUENCY REFERENCE

CROSS-REFERENCE TO RELATED APPLICATION

This is a continuation-in-part application of pending U.S. nonprovisional application Ser. No. 09/231,456, filed Jan. 14, 1999 and entitled "Integrated Accurate Thermal Frequency Reference."

BACKGROUND OF THE INVENTION

1. Field of the Invention

The present invention relates to a VCO and filter, and in particular, to a circuit in which the output bandwidth of the filter and output frequency of the oscillator are controlled by the same control bias current signal. This control signal may be generated from a frequency reference formed from standard IC components utilizing the thermal time constant of silicon.

2. Description of the Related Art

Oscillators are well known in the art of solid state electronics. Oscillator circuits producing a constant frequency signal are extremely useful for performing vital system functions such as clocking. Any constant frequency oscillator requires: 1) a source of power; 2) an amplifying device; and 3) some form of resonant circuit to maintain the frequency of the output.

Many solid-state circuits include a separate crystal having an intrinsic vibrational frequency. Such a circuit utilizes the crystal's inherent vibration to generate a constant frequency output signal. Unfortunately, incorporating an external component such as a crystal into an IC creates additional complexity and expense in the manufacturing process.

Therefore, there is a need in the art for a structure formed from standard integrated circuit components that is capable of maintaining the output of an oscillator at a regular frequency.

Filters are also well known in electronics, and find use in a wealth of applications. Many filters include resistive and capacitive elements, with the resistance and capacitance exhibited by these elements determining bandwidth of the filter output.

Unfortunately, there has been long-standing difficulty in producing filters having precise characteristics for use in integrated circuits. This is attributable to the uncertainty in absolute values of resistance and capacitance exhibited by structures created by conventional silicon fabrication processes.

As discussed in detail below in connection with the operation of conventional switched capacitor filter, one way of surmounting this problem is to introduce an external signal of constant frequency into the circuit. However, this again entails substantial additional expense.

Therefore, there is a need in the art for a filter design that can be incorporated into an integrated circuit and which does not depend upon a constant-frequency clock signal provided by an external source.

SUMMARY OF THE INVENTION

The present invention relates to a frequency reference structure, a voltage controlled oscillator, and a filter, each of which may take advantage of the thermal resistance and capacitance of single crystal silicon to ensure uniformity of output.

The frequency reference is fabricated from a thermal RC network positioned in silicon in the form of a lateral array of bipolar transistors. Application of a clock signal from a voltage-controlled oscillator to the silicon produces a heat pulse which propagates through the silicon and across this thermal network.

Because the base-emitter voltage ($V_{be}$) of the bipolar transistors is highly temperature dependent, propagation of the heat pulse through the silicon causes a fluctuation in $V_{be}$ of the arrayed transistors. Comparison of the $V_{be}$ appearing across two transistors in the array results in a combined voltage signal whose magnitude is determined by the distance between the transistors and the time constant $\tau$ of the thermal RC network. This time constant $\tau$ is solely a function of the volume of single crystal silicon present between the laterally-arrayed bipolar transistors. It is independent of the amplitude, frequency, and duty cycle of the original clock signal.

In accordance with the present invention, the original clock signal and the time-delayed voltage signal of the thermal RC network are compared, and the phase shift between these signals determined. A control bias current corresponding to this phase difference is then generated.

This control bias current can be fed back to a voltage-controlled oscillatory featuring a variable transconductance amplifier as the resistive element on the negative feedback loop. Control of negative feedback with the control bias current ensures generation of an output signal having a constant frequency. This control bias current can also be simultaneously fed to a transconductance amplifier making up the resistive element of a filter structure, thereby also permitting control over the effective bandwidth of the filter.

A method of calibrating a filter in accordance with one embodiment of the present invention comprises the steps of conveying a variable control bias current signal to a current input node of a first variable transconductance amplifier forming a resistive element of a filter, the first variable transconductance amplifier including a noninverting input node and positioned in series with a shunt capacitor, an output of the variable transconductance amplifier in negative feedback with an inverting input node of the variable transconductance amplifier. The variable control bias current signal is also conveyed to a current input node of a second variable transconductance amplifier forming a resistive element of a voltage controlled oscillator, whereby the variable control bias current signal calibrates a bandwidth of the filter with an output frequency of the voltage controlled oscillator.

An apparatus for producing an output signal with a substantially constant frequency in accordance with one embodiment of the present invention comprises a semiconductor workpiece having a thermal resistance and a thermal capacitance, and a voltage controlled oscillator formed in the semiconductor workpiece. The voltage controlled oscillator is configured to receive a control bias current signal and in response produce a clock signal having a first frequency. A heat source is positioned at a first point within the semiconductor workpiece, the heat source configured to receive the clock signal and in response generate a heat pulse in the semiconductor workpiece. A thermal network is formed within the silicon and has a thermal time constant, the thermal network configured to receive the heat pulse and produce a voltage signal based upon the thermal time constant. A limiting amplifier is configured to receive, amplify, and limit the voltage signal to produce a clipped output voltage. A comparator is configured to receive the clock signal and the clipped output voltage and produce the control bias current signal corresponding to a phase difference between the clock signal and the clipped output voltage, wherein the voltage controlled oscillator alters the first frequency of the clock signal in response to the control bias current signal.

A method for maintaining constant frequency output of a voltage controlled oscillator in accordance with one embodiment of the present invention comprises the steps of applying a clock signal from a voltage controlled oscillator to a first point of a semiconductor workpiece, and generating a heat pulse at the first point of the semiconductor workpiece based upon the clock signal. A voltage signal is produced based upon a thermal time constant of a thermal network formed within the semiconductor workpiece, and the voltage signal is amplified and limited to produce a clipped output voltage. The clock signal and the clipped output voltage are compared to produce a control bias current corresponding to a phase difference between the clock signal and the clipped output voltage. The frequency of the clock signal is altered in response to the control bias current.

A voltage controlled oscillator in accordance with one embodiment of the present invention comprises an oscillator input node configured to receive an input voltage signal, and a first operational amplifier. The first operational amplifier has a noninverting input node, an inverting input node, and an oscillator output node, the noninverting input node of the first operational amplifier configured to receive the input voltage signal from the oscillator input node, and the oscillator output node configured to produce a clock signal. A positive feedback loop is positioned between the oscillator output node and the noninverting input node, the positive feedback loop including a first transconductance amplifier configured to receive a first control bias current. A negative feedback loop is positioned between the oscillator output node and the inverting input node of the first operational amplifier, the negative feedback loop including a second transconductance amplifier and a shunt capacitor, the second transconductance amplifier configured to receive a second control bias current which varies relative to the first control bias current.

A filter in accordance with one embodiment of the present invention comprises a filter input node configured to receive an input voltage signal, and a transconductance amplifier configured to receive the input voltage signal from the filter input node and a control bias current from a variable current source, the transconductance amplifier configured to produce an output signal. A shunt capacitor is in electrical communication with the transconductance amplifier and a filter output node.

The features and advantages of the present invention will be understood upon consideration of the following detailed description of the invention and the accompanying drawings.

DETAILED DESCRIPTION

1. Thermal Frequency Reference

Propagation of heat through single crystal silicon can be modeled as though the silicon were composed of a series of concentric shells having the same thicknesses and increasing volumes. The heat will distribute uniformly across each shell and decrease with distance from the point of application of the thermal energy.

Figure 1:
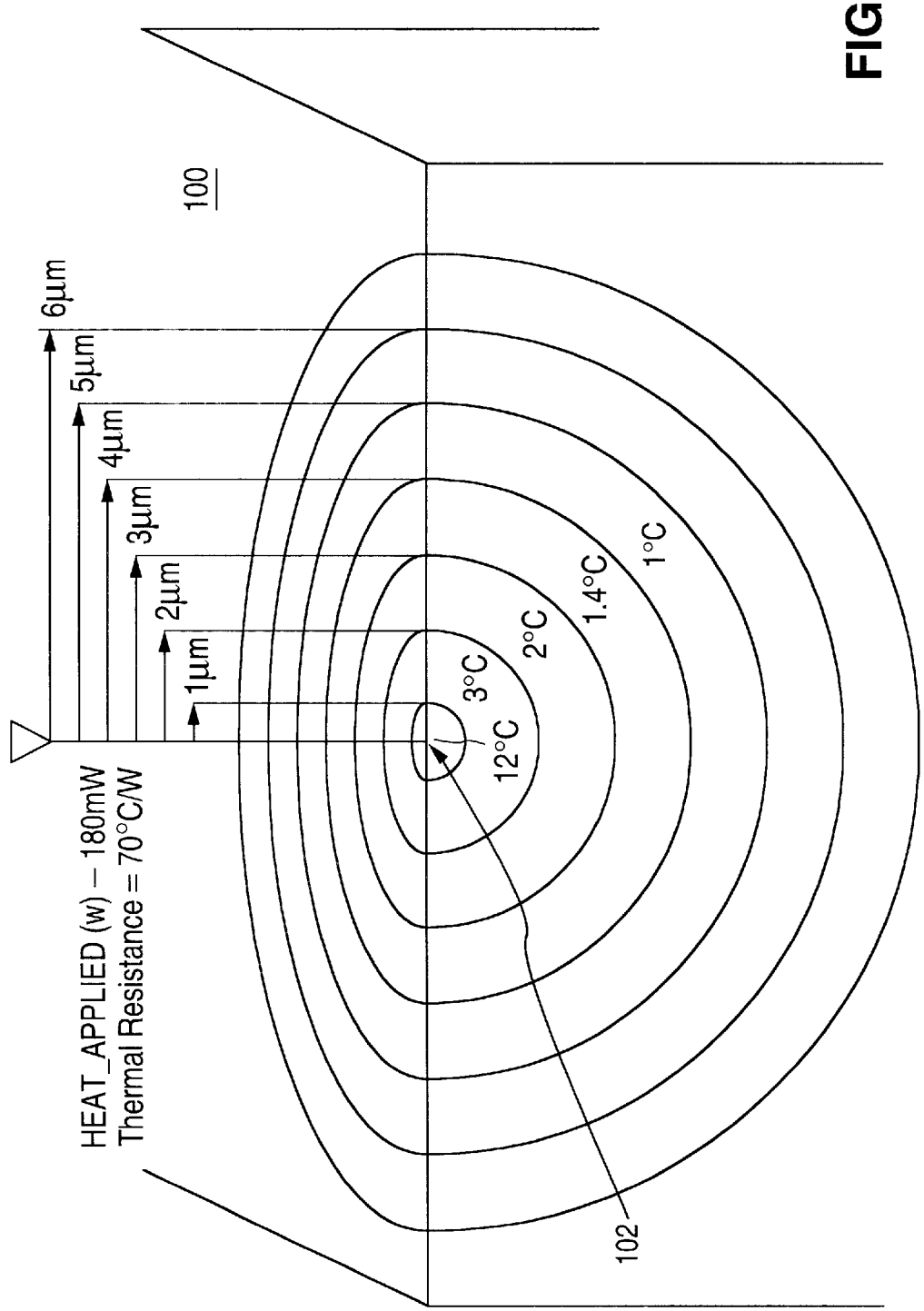
FIG. 1 shows a concentric shell model illustrating the propagation of thermal energy through silicon.

FIG. 1 shows a concentric shell model illustrating the propagation of thermal energy through a silicon block 100. As is depicted in FIG. 1, the application of a "HEAT_APPLIED" electrical pulse of 180 mW at point 102 of silicon block 100 causes the propagation of a heat signal through the silicon.

Specifically, the temperature in the silicon rises 12° C. at the point of application of the electrical pulse. At a distance of 1 µm from point 102, the temperature of the silicon rises 3° C. At a distance of 2 μm from point 102, the temperature of the silicon rose 2° C. At distances of 3 μm and 4 μm from point 102, the temperature of the silicon rose 1.4° C. and 1° C., respectively.

This propagation of thermal energy through the silicon can be modeled as though it were an electrical voltage signal passing through an RC network. The silicon shells 102 in FIG. 1 can each be viewed as exhibiting a thermal resistance and a thermal capacitance.

TABLE 1 reveals the correlation between these thermal properties and their more familiar electrical equivalents:

TABLE 1

| PROPERTY | ELECTRICAL UNITS | THERMAL UNITS |
|---|---|---|
| Potential | Volts | ° C. |
| Current | Amps | Watts |
| Resistance | Volts/Amps = Ohms | ° C./Watt |
| Capacitance | Q/Volts = Farad | ° C./Joule |

The thermal resistance ($C_{th\_si}$) of silicon varies over temperature, and is governed by Equation (I) below:

$$R_{th\_Si} = \frac{350}{(T-68)}\left(\frac{W}{cm \cdot K}\right) \quad (I)$$

The thermal capacitance of silicon ($C_{th\_si}$) is closely related to its specific heat. In theory, the thermal capacitance ($C_{th}$) of most solids is governed by Equation (II) below:

$$C_{th} = 3 \cdot R \approx 25.031 \frac{J}{M \cdot K} = 1.126 \frac{J}{g \cdot K} \quad (II)$$

The value shown in Equation (II) is the result of an approximation utilizing the Dulong Petit Law. The value of thermal capacitance for most minerals is about 1.3 J/(g~K).

Empirically, no consistent value for $C_{th\_Si}$ has emerged from reviewing the literature. One approximation is given by:

$$C_{th\_Si} \approx 20 \frac{J}{Mol \cdot K} = .76 \frac{J}{g \cdot K}$$

Figure 2:
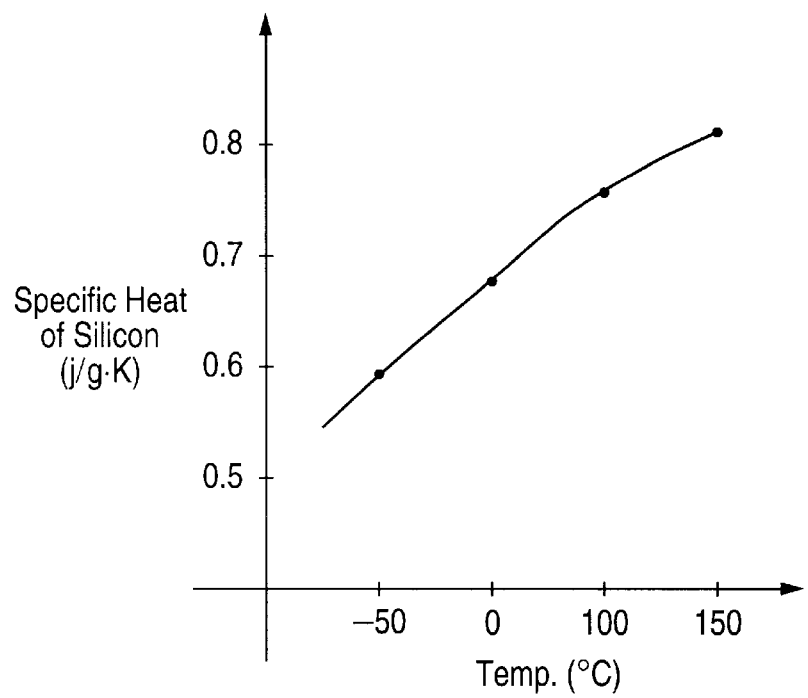
FIG. 2 plots the specific heat of silicon versus temperature.

FIG. 2 plots the specific heat of silicon over a temperature range. The data in FIG. 2 is taken from "Inductor-less, Capacitor-less State-Variable Electrothermal Filters", by Wynand J. Luow et al., IEEE Journal of Solid State Circuits, Vol. SC-12, No. 4, August 1977.

Because propagation of thermal energy through silicon may be modeled as though it were a voltage applied to an RC network, a temperature change in silicon at a given distance from the point of application of a heat pulse will vary according to a time delay τ from the time of application of the initial heat pulse. This thermal time constant τ is a function of only the spacing of the points of temperature measurement. It is independent of the amplitude, frequency, and duty cycle of the electrical signal originally giving rise to the heat pulse. Because of this consistency in the value of τ, it can be utilized to generate an output signal having a constant frequency.

To understand this, recall first that an RC network may be pictured as a number of resistors and capacitors connected in series. However, an RC network may also take the form of series of bipolar transistors.

Figure 3:
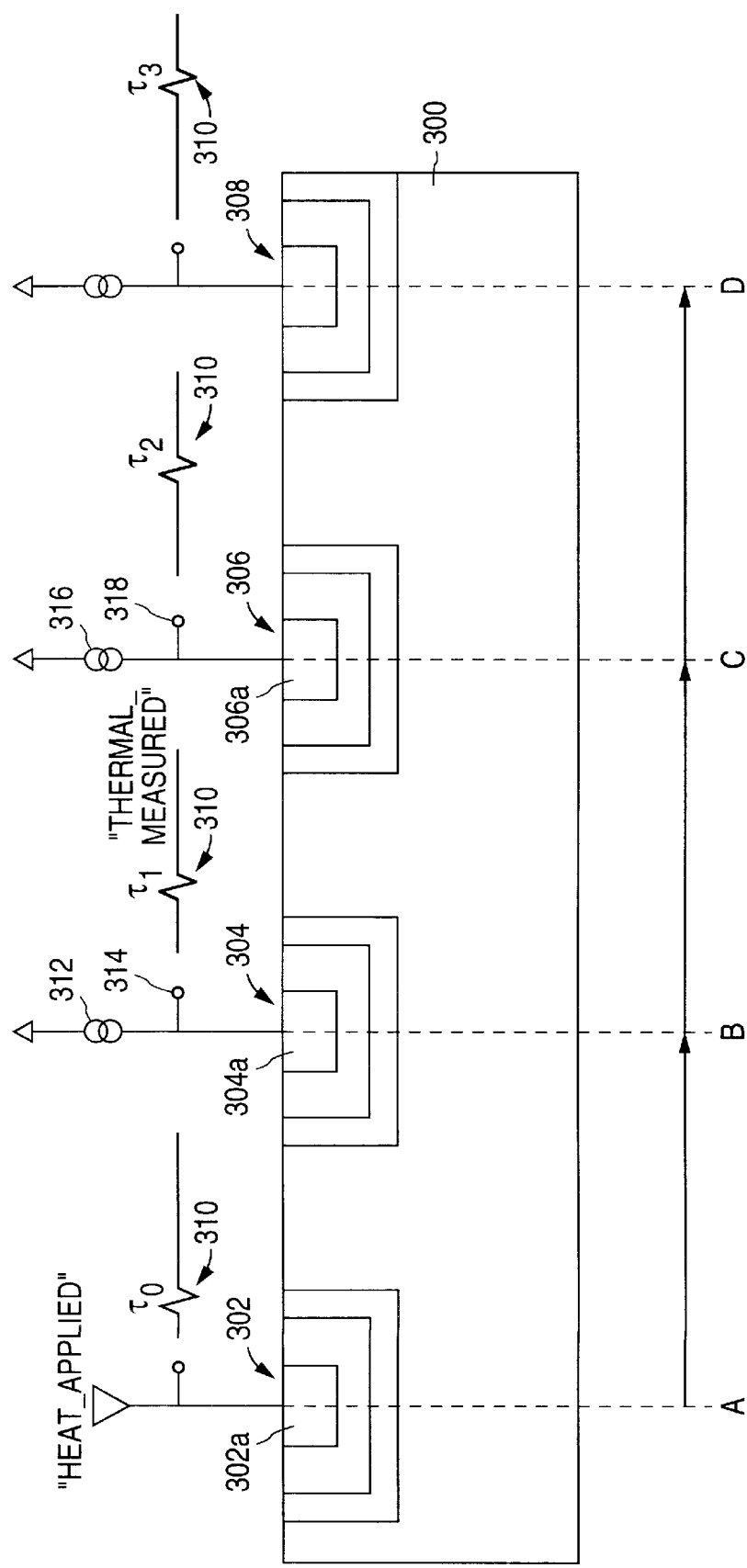
FIG. 3 illustrates a cross-sectional view of a thermal RC network in the form of a series of four laterally-arrayed PNP bipolar transistors formed within silicon.

FIG. 3 illustrates a cross-sectional view of a series of four laterally-arrayed PNP bipolar transistors 302, 304, 306, and 308 formed within silicon block 300. Bipolar transistors 302, 304, 306, and 308 are electrically isolated from each other. When a HEAT_APPLIED electrical signal is applied to emitter 302a of first PNP transistor 302, a heat pulse 310 is generated at point A in silicon block 300.

Heat pulse 310 then propagates through silicon block 300. Second bipolar transistor 304 is formed having an emitter 304a located at point B. Emitter 304a is in electrical contact with a constant current source 312. When heat pulse 310 reaches emitter 304a of second bipolar transistor 304, the conductance of transistor 304 will change. This conductivity change will be reflected in a change in $V_{be}$ of transistor 304. This change in $V_{be}$ can be detected at node 314 as a THERMAL_MEASURED voltage signal.

Because of the thermal resistance and capacitance of silicon between A and B, emitter 304a of second bipolar transistor 2-4 will experience heat pulse 310 and generate the THERMAL_MEASURED voltage signal delayed by a first time constant $\tau_1$. This time constant $\tau_1$ is independent of the characteristics of the initial HEAT_APPLIED voltage signal applied to emitter 302a of first PNP transistor 302.

Third bipolar transistor 306 is formed within silicon 300, such that its emitter 306a is located at point C. Emitter 306a is in electrical contact with a constant current source 316.

When the heat pulse 310 reaches emitter 306a of third bipolar transistor 306, the conductivity of transistor 306 will change. This change in conductivity will be reflected in a change in the $V_{be}$ of transistor 306. This change in $V_{be}$ can be detected at node 318.

Because of the thermal resistive and capacitive properties of the silicon present between points A and C, emitter 306a of second bipolar transistor 306 will experience the heat pulse and the resulting change in $V_{be}$ delayed by a second time constant $\tau_2$. This time constant is independent of the nature of the initial HEAT_APPLIED voltage signal applied to emitter 302a of the first PNP transistor 302. Moreover, because the distance AC is greater than the distance AB, $\tau_2 > \tau_1$.

The above description of the second and third bipolar transistors is the same for fourth transistor 308.

It is therefore possible to utilize this lateral arrangement of bipolar transistors to generate an output signal having a constant frequency output. This is accomplished by first detecting the phase difference between the time-delayed RC waveforms at the emitters of the bipolar transistors and then modulating the output of a circuit in response to this phase difference.

Figure 4B:
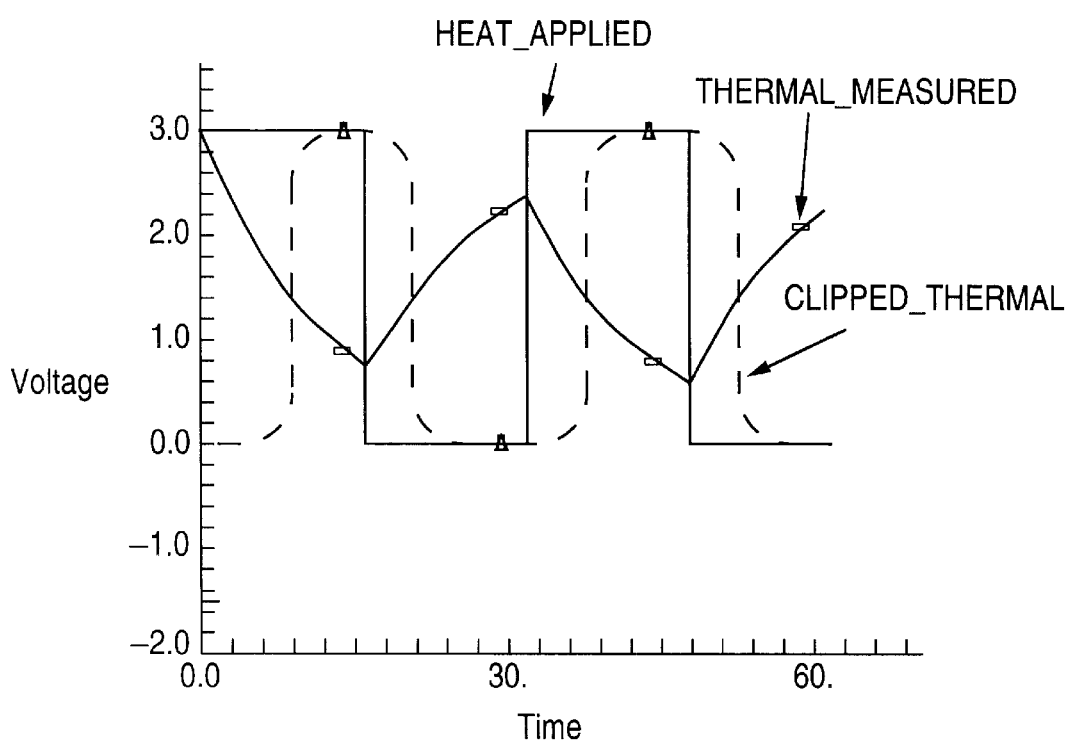
FIG. 4B plots waveforms for the HEAT_APPLIED voltage, the THERMAL_MEASURED voltage, and the CLIPPED_THERMAL voltage for the detection circuit shown in FIG. 4A.
Figure 4A:
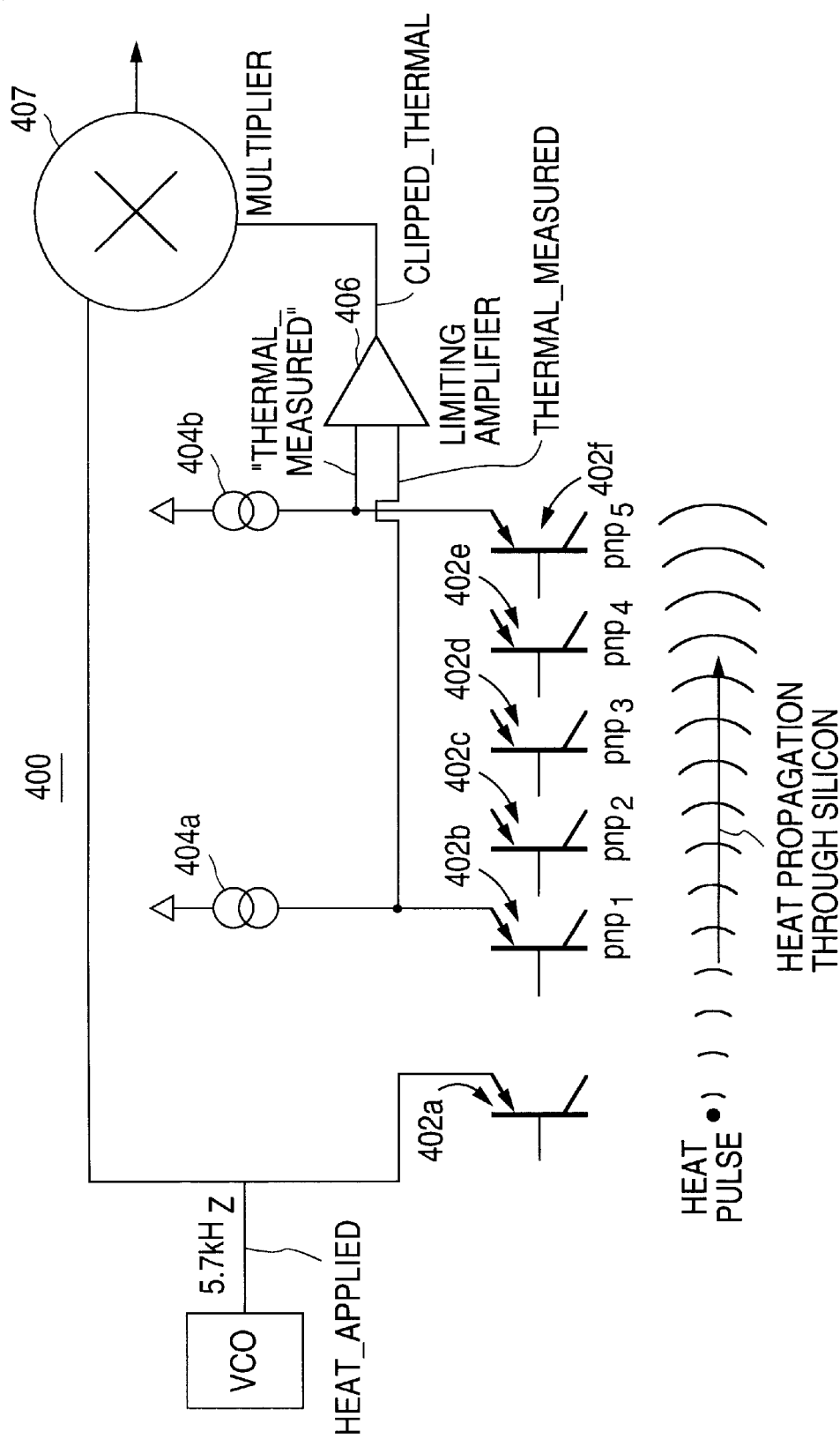
FIG. 4A shows a schematic of a detection circuit in accordance with one embodiment of the present invention utilizing six laterally arrayed PNP transistors connected to an FM detector.

FIG. 4A shows a schematic of a first embodiment of a detection circuit 400 in accordance with the present invention, which utilizes a thermal RC network like that shown in FIG. 3. Specifically, the thermal RC network comprises a lateral array of six PNP transistors 402a–402f. First arrayed transistor 402a serves as the heat source for the thermal RC network, and the emitter of transistor 402a receives the HEAT_APPLIED signal from the VCO. The emitters of arrayed transistors 402b and 402f are connected to constant current sources 404a and 404b. The emitters of transistors 402b and 402f are also connected to a limiting amplifier 406.

The THERMAL_MEASURED $V_{be}$ of transistors 402b and 402f are transmitted to limiting amplifier 406. Limiting amplifier 406 receives, amplifies, and limits these THERMAL_MEASURED signals and produces a CLIPPED_THERMAL signal reflecting the difference between them.

The purpose of comparing the THERMAL_MEASURED voltages of two separate transistors of the array is to eliminate the effect of ambient temperature changes upon the circuit. If the phase difference between the clock signal and the thermal signal were determined utilizing the THERMAL_MEASURED signal of only one transistor, the circuit would reflect changes in the $V_{be}$ of that transistor attributable to a rise or fall in ambient temperature. By generating the composite CLIPPED_THERMAL voltage from THERMAL_MEASURED voltages of transistors experiencing the same ambient temperature, only voltage changes attributable to the heat pulse will be registered by the circuit.

The CLIPPED_THERMAL output of limiting amplifier 406 is then fed to analog multiplier 407. Multiplier 407 also receives the original clock signal, and frequency modulation detection techniques are used to determine the phase shift of the original clock (HEAT_APPLIED) signal relative to the changed $V_{be}$ (CLIPPED_THERMAL) waveform of the thermal RC network. As discussed above in connection with FIG. 4A, because this phase shift is dependent upon T, it is wholly independent of the amplitude and duty cycle of the applied clock signal.

FIG. 4B plots waveforms for the HEAT_APPLIED voltage (the clock signal), the THERMAL_MEASURED voltage, and the CLIPPED_THERMAL voltage for circuit 400. FIG. 4B reveals that when the HEAT_APPLIED voltage is applied, heat is pulsed through the silicon and transistors located at a given distance from the point of application of thermal energy experience a change in $V_{be}$. This changed $V_{be}$ (the THERMAL_MEASURED voltage) will exhibit a typical RC waveform. The time constant τ of this RC waveform is solely a function of the thermal properties of the silicon crystal and the spacing of the transistors within the silicon. It is independent of the amplitude, frequency, and duty cycle of the original HEAT_APPLIED signal.

Figure 4C:
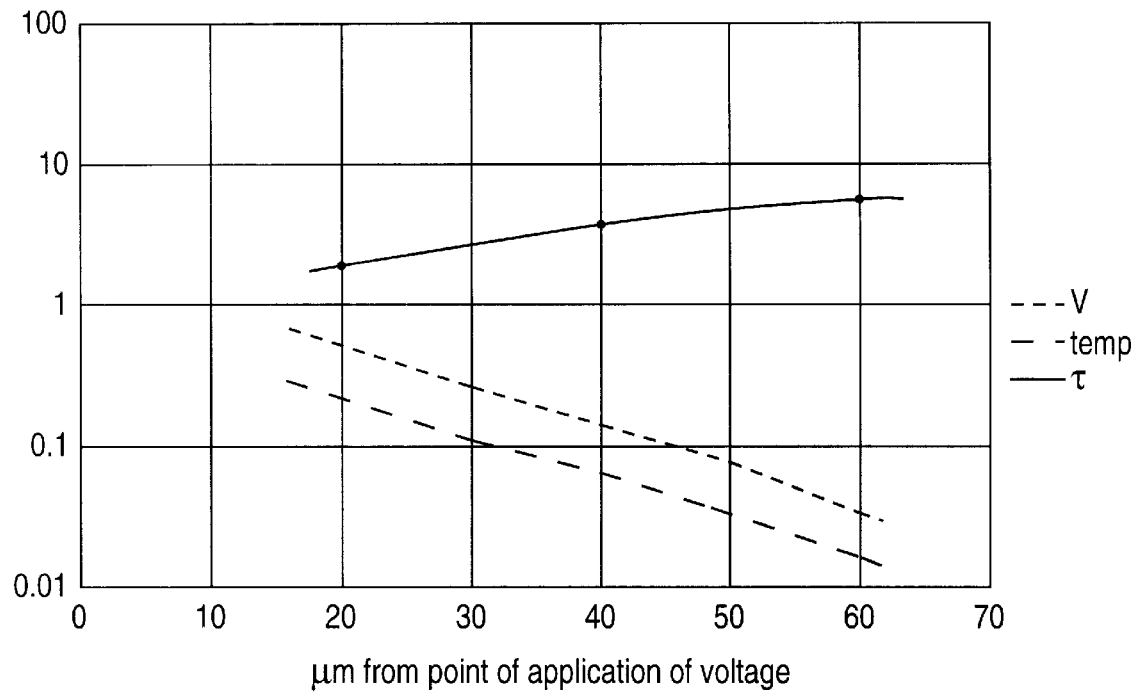
FIG. 4C plots simulated voltage, temperature, and time delay as a function of distance from the point of initial application of thermal energy, for the thermal RC network/transistor array shown in FIG. 4A.

FIG. 4C plots simulated and measured voltage, temperature, and time constant as a function of distance from the point of initial application of thermal energy, for the transistor array shown in FIG. 4A. As expected, the silicon temperature declines moving away from the point of application of the thermal energy. As a direct result, the $\Delta V_{be}$ experienced by the transistors also declines moving away from the point of application of the HEAT_APPLIED voltage. Also as expected, the overall time constant τ of the thermal RC network increases at greater distances from the point of application of the HEAT_APPLIED voltage.

Figure 4D:
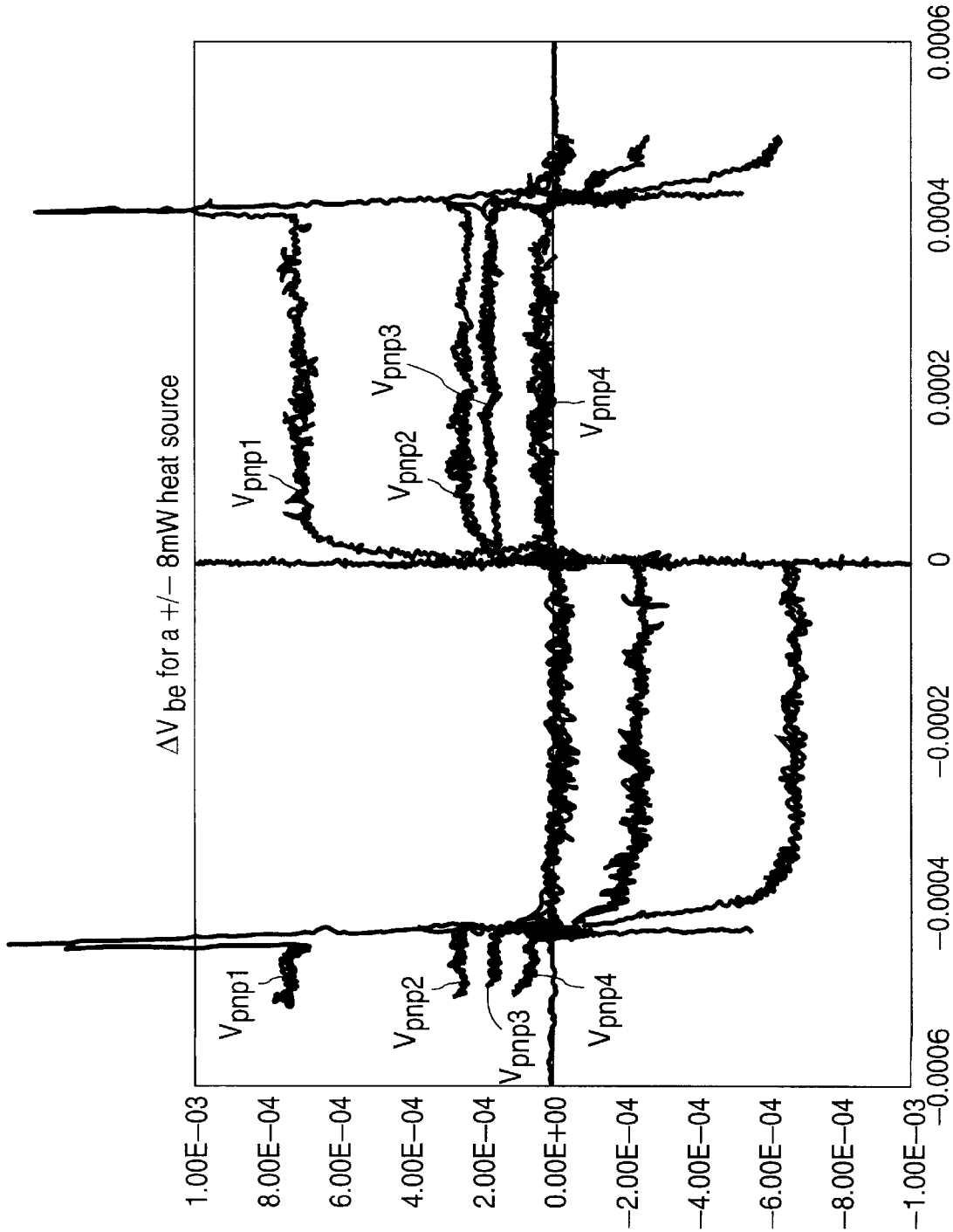
FIG. 4D plots an experimentally observed thermal shift in $V_{be}$ offset over time, for the first, second, third, and fourth transistors of an actual lateral array of six PNP transistors.

FIG. 4D plots experimentally observed shifts in $V_{be}$ for the second, third, fourth, and fifth transistors of an actual detection circuit utilizing a thermal RC network in the form of a six-PNP transistor lateral array. As expected, the $\Delta V_{be}$ experienced by the transistor in the array nearest to application of heat ($\Delta V_{pnp}$) is larger than the change in voltage experienced at the second ($\Delta V_{pnp2}$), third ($\Delta V_{pnp3}$), and fourth ($\Delta V_{pnp4}$) transistors: $\Delta V_{pnp1} > \Delta V_{pnp2} > \Delta V_{pnp3} > \Delta V_{4pnp}$.

2. Voltage Controlled Oscillator

Figure 5:
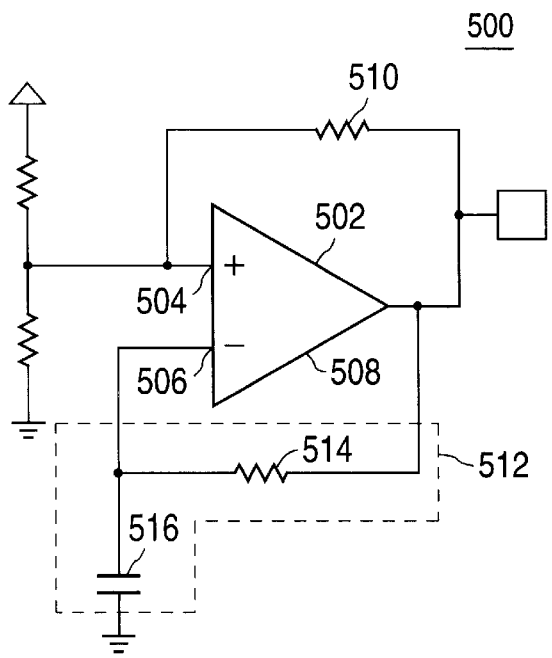
FIG. 5 shows a schematic diagram of a conventional oscillator circuit.

FIG. 5 shows a schematic diagram of a conventional oscillator circuit. Oscillator circuit 500 includes operational amplifier 502 having a noninverting input node 504 and an inverting input node 506. Operational amplifier 502 also includes an output node 508. Voltage at output node 508 is fed back to noninverting input node 504 through resistor 510. Voltage at output node 508 is fed back to inverting input node 506 through RC network 512 including resistor 514 and shunt capacitor 516.

The frequency of oscillation of circuit 500 is determined by both positive and negative feedback. The voltage at output node 508 toggles between high ($V_{cc}$) and low (GND) voltages established by the power supply. This output voltage is attenuated when it arrives at the noninverting input node 504 such that it now toggles at a high voltage which is lower than the $V_{cc}$ and a low voltage which is higher than GND. The voltage at inverting input node 506 follows the voltage at noninverting input node 504, delayed by the time constant of the RC network of the negative feedback loop.

Once capacitor 516 becomes charged such that the voltage at negative input node 506 attains the voltage at positive input node 504, operational amplifier 502 will switch and output node 508 will toggle (from either high to low or low to high). The RC network in the negative feedback loop will thus be forced to follow this change in voltage. The frequency of output of oscillator 500 at output node 506 will obey the following equation:

$$\text{Freq} = K/(RC) \tag{III}$$

where K is determined by attenuation between output node 508 and noninverting input node 504.

Unfortunately there has been a long-standing difficulty in producing self-contained accurate frequency timing self-contained within an integrated circuit. This is due to the fact that traditional processing techniques are unable to sufficiently control dopant concentration to assure fabrication of semiconductor devices having absolute values of resistance and capacitance that vary by less than about ±20% for various chips. This uncertainty in the values of R and C of Eq. (III) will therefore affect the frequency of oscillation.

Figure 6:
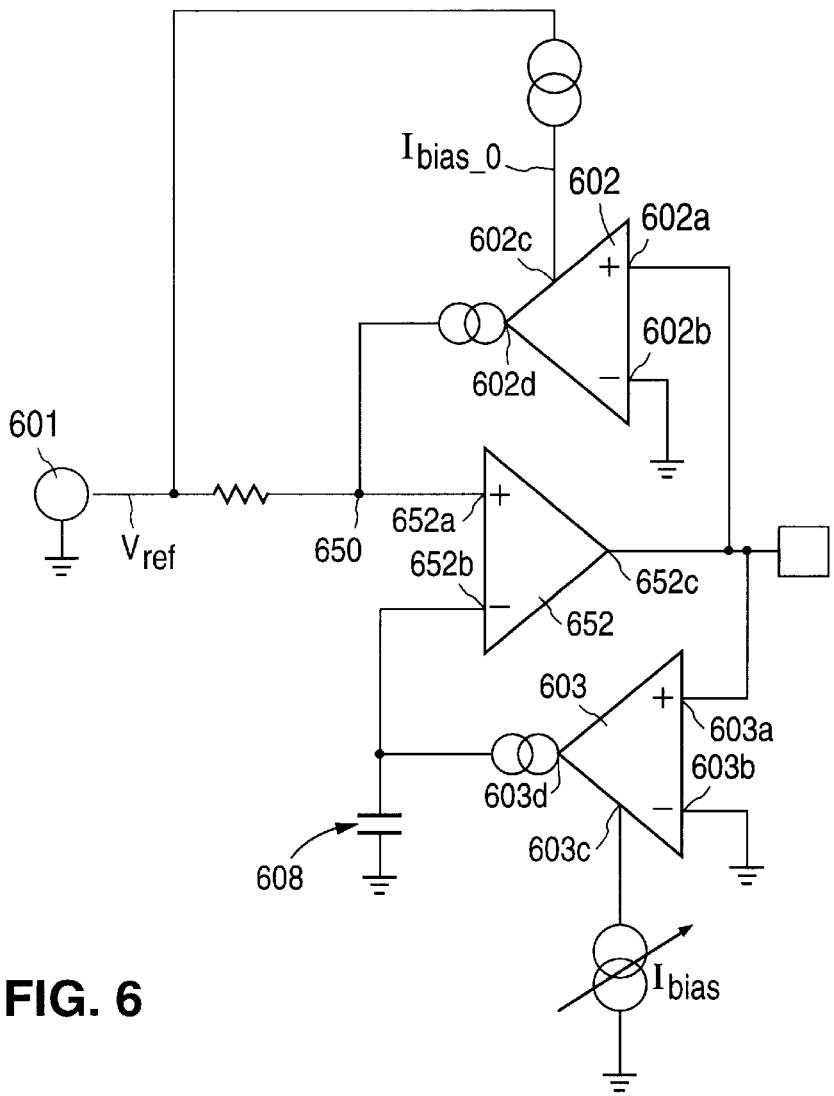
FIG. 6 shows a schematic diagram of a voltage controlled oscillator circuit in accordance with one embodiment of the present invention.

However, this variation can be overcome by applying a control bias current to a transconductance amplifier resistive element present in the negative feedback loop of the VCO. FIG. 6 thus shows a schematic diagram of a voltage controlled oscillator (VCO) circuit 600 in accordance with one embodiment of the present invention.

VCO 600 is similar to the simple oscillator circuit shown in FIG. 5, except that fixed transconductance amplifier 602 is substituted for the resistor in the positive feedback loop, and variable transconductance amplifier 603 is substituted for the resistor in the negative feedback loop.

VCO 600 receives a constant reference voltage ($V_{ref}$) from voltage reference structure 601 (typically a band gap reference). VCO 600 is biased up both in terms of voltage ($V_{ref}$) and current ($I_{bias\_0}$) from reference voltage 601.

The output frequency of VCO 600 can be controlled by applying a control bias current ($I_{bias}$) to variable transconductance amplifier 603. Because the voltage at noninverting input 604 toggles between well-defined voltages established by feedback through fixed transconductance amplifier 602, the output frequency of VCO 600 can be tuned by adjusting the $I_{bias}$ control current applied to variable transconductance amplifier 603. Varying $I_{bias}$ adjusts the rate and time for shunt capacitor 608 to ramp between its discharged and charged states.

The voltage controlled oscillator 600 shown in FIG. 6 comprises an oscillator input node 650a configured to receive an input voltage signal, an operational amplifier 652 having a noninverting input node 652a, an inverting input node 652b, and an oscillator output node 652c. Noninverting input node 652b is configured to receive the input voltage signal from oscillator input node 650, and oscillator output node 652c is configured to produce a clock signal.

Voltage controlled oscillator 600 also includes a positive feedback loop between oscillator output node 652c and oscillator input node 650. The positive feedback loop includes fixed transconductance amplifier 602 configured to receive a constant bias current ($I_{bias\_0}$).

Voltage controlled oscillator 600 also includes a negative feedback loop between oscillator output node 652*c* and inverting input node 652*b* of operational amplifier 652. This negative feedback loop includes variable transconductance amplifier 603 and a shunt capacitor 608, variable transconductance amplifier 603 configured to receive a control bias current $I_{bias}$ which varies relative to constant bias current $I_{bias\_0}$.

Fixed transconductance amplifier 602 of VCO 600 includes noninverting input node 602*a*, inverting input node 602*b*, bias current input node 602*c*, and output node 602*d*. Noninverting input node 602*a* is in electrical communication with oscillator output node 652*c*. Inverting input node 602*b* is in electrical communication with ground. Bias current input node 602*c* is in electrical communication with the bias current from voltage reference 601. Output node 602*d* is in electrical communication with noninverting input node 652*a* of operational amplifier 652.

Variable transconductance amplifier 603 of VCO 600 includes noninverting input node 603*a*, inverting input node 603*b*, control current input node 603*c*, and output node 603*d*. Noninverting input node 603*a* is in electrical communication with oscillator output node 652*c*. Inverting input node 603*b* is in electrical communication with ground. Control current input node 603*c* is in electrical communication with control bias current $I_{bias}$. Output node 603*d* is in electrical communication with shunt capacitor 608 and inverting input node 652*b* of operational amplifier 652.

During operation of VCO 600, the $I_{bias}$ current control signal can be fed to the negative feedback loop of VCO 600 in order to generate a regular frequency output. Under such operating conditions, the $I_{bias}$ signal would also reflect variation in electrical resistance and capacitance on the chip attributable to processing. Therefore, the following section describes use of the $I_{bias}$ current control signal to control the bandwidth of a filter to compensate for the inherent variation in resistance and capacitance.

3. Filter

Figure 7:
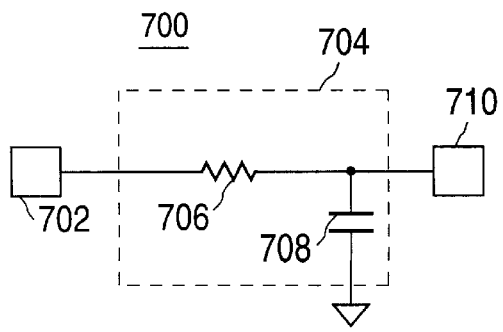
FIG. 7 shows a schematic diagram of a conventional frequency filter.

Filters are well known in electronics, and find use in a variety of applications. FIG. 7 shows a conventional filter 700, wherein an electrical voltage signal is applied to input node 702 of filter 700. This signal passes through RC network 704 including resistor 706 and capacitor 708, and then appears on output node 710. The time delay associated with charging and discharging capacitor 708 restricts passage of electrical current corresponding to a particular frequency range, thereby determining the bandwidth of the filter.

Unfortunately, there has been long-standing difficulty in producing filters having precise characteristics for use in integrated circuits. This is again attributable to the uncertainty in absolute values of resistance (R) and capacitance (C) of structures created by conventional fabrication processes. The variation in R and C introduced by processing techniques affects the behavior of the RC network. Resistor structures formed utilizing semiconductor fabrication processes also exhibit poor temperature characteristics and linearity characteristics, and consume relatively large regions of valuable surface area of the chip.

Figure 8:
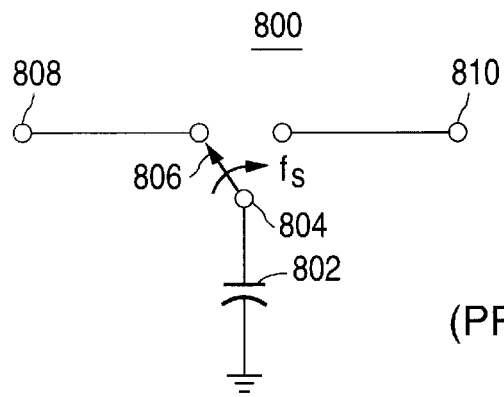
FIG. 8 shows a schematic diagram of a conventional switched capacitor circuit.

Switched capacitor filters were designed to overcome these problems. FIG. 8 shows schematic diagram of a conventional switched capacitor circuit. Switched capacitor circuit 800 includes capacitor 802 connected between ground and an active node 804. Switch 806 alternatively connects active node 804 to either input node 808, or output node 810. Switch 806 alternates positions according to a switching frequency ($f_s$). Assuming 1) switch 806 remains connected to input node 808 and output node 810 long enough to fully charge and discharge capacitor 802, and 2) $f_s$ is higher (by a factor of at least two) than the frequency of the electrical signal on input node 808, switched capacitor 800 simulates an electrical resistance in the manner of a conventional resistor.

Figure 9:
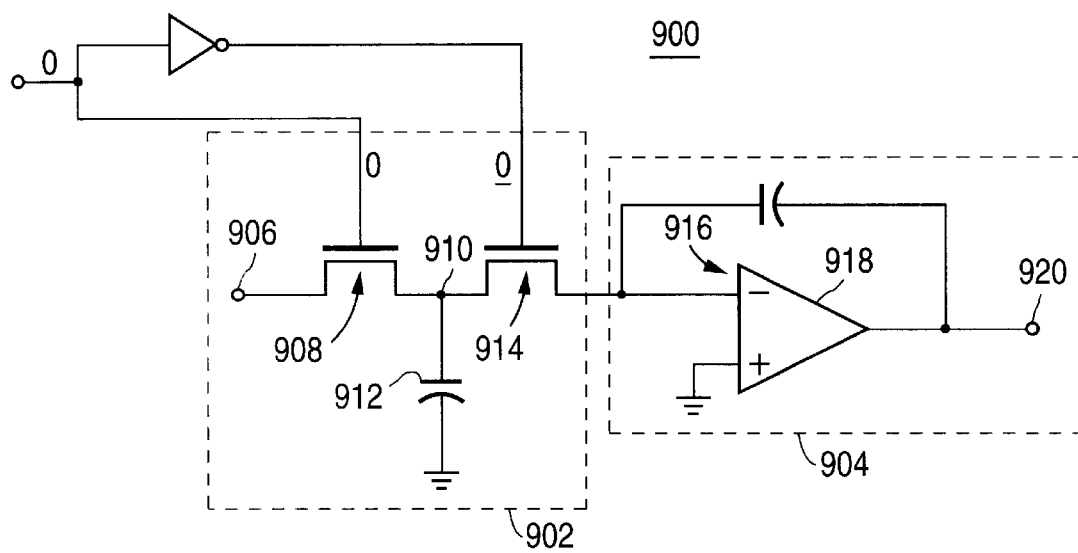
FIG. 9 shows a schematic diagram of a conventional switched capacitor filter utilizing MOS technology.

Accordingly, FIG. 9 shows incorporation of a switched capacitor in a conventional filter structure utilizing metal oxide semiconductor (MOS) components. Switched capacitor filter structure 900 includes a switched capacitor circuit 902 connected to an integrator circuit 904.

Switched capacitor circuit 902 includes input node 906 connected to the source of first MOS switching transistor 908. The drain of first MOS switching transistor 908 is connected to active node 910. Active node 910 lies on one side of grounded capacitor 912.

The source of second MOS switching transistor 914 is connected to active node 910. The drain of second MOS switching transistor 914 is connected to inverting input 916 of op-amp integrator 904.

The gate of first MOS switching transistor 308 receives clock signal φ. The gate of second MOS switching transistor 914 receives the clock complement signal $\bar{\phi}$. Application of the clock and clock complement signal to the gates of first and second MOS switching transistors 908 and 914 alternatively permits charging and discharging of grounded capacitor 912.

Op-amp integrator 904 receives an electrical input from discharging capacitor 912 through second MOS switching transistor 914. Op-amp integrator 904 in turn produces a filtered signal at output node 920.

The conventional switched capacitor filter depicted in FIG. 9 is adequate for many applications. However, this design suffers from several disadvantages.

One disadvantage of the switched capacitor filter is that a clock signal having a fixed frequency must be provided to synchronize operation of the MOS switching capacitors. This clock signal is typically generated by an external component, such as a crystal oscillator. Unfortunately, utilization of such an external component substantially enhances the cost of the filter.

Therefore, there is a need in the art for a filter design that can be incorporated into an integrated circuit and which does not depend upon a constant-frequency clock signal provided by an external source.

A second disadvantage associated with conventional switched capacitor filters is that any input signal having a frequency greater than one-half the switching frequency ($f_s$) can be interpreted as a legitimate signal, rather than as a filtered signal. As a result, digital switched capacitor filters often require pre-filtering in order to prevent such "aliasing". This prefiltering requires the presence of additional structures which consume precious silicon surface area and thereby increase cost.

Therefore, there is a need in the art for a filter that can be incorporated into an integrated circuit and which does not require pre-filtering of the input signal.

In accordance with the present invention, if the output frequency of a VCO is adjusted such that the time delay of the silicon thermal heat pulse is a well-known ratio of the period of the VCO, an adjustment signal for an associated filter structure is an inevitable by-product of the thermal frequency reference. No external structure is required to provide this voltage adjustment.

The elements of both switched capacitor filters and transconductance filters are essentially the same. Both switched capacitor and transconductance filters require a resistance to track a capacitance over a range of temperatures and processing conditions.

Figure 10:
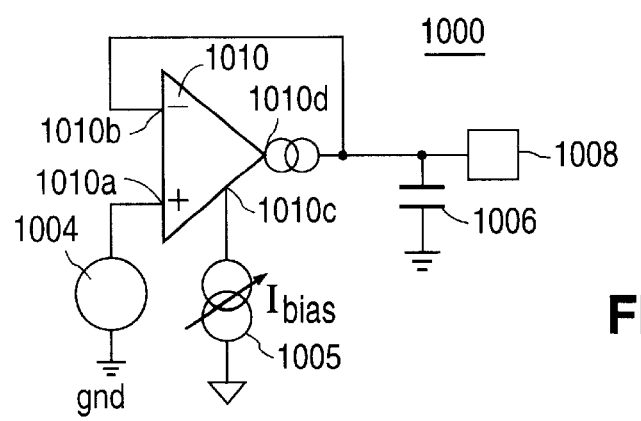
FIG. 10 shows a schematic diagram of a filter employing a transconductance amplifier in accordance with one embodiment of the present invention.

Accordingly, FIG. 10 shows a filter 1000 as in prior FIG. 7, wherein the resistor has been replaced by a variable transconductance amplifier structure.

Filter 1000 comprises a filter input node 1010a configured to receive an input voltage signal. Filter 1000 also includes variable transconductance amplifier 1010 configured to receive the input voltage signal from the filter input node 1004 and a control bias current $I_{bias}$ from a variable current source 1005. Variable transconductance amplifier 1010 is also configured to produce an output signal. Shunt capacitor 1006 is in electrical communication with variable transconductance amplifier 1010 and filter output node 1008.

Variable transconductance amplifier 1010 includes noninverting input node 1010a, inverting input node 1010b, control current input node 1010c, and output node 1010d. Noninverting input node 1010a is configured to receive the input voltage signal and control current input node 1010c is configured to receive the variable control bias current $I_{bias}$ from variable current source 1005. Filter 1000 further includes a feedback loop between output node 1010d and inverting input node 1010b of variable transconductance amplifier 1010.

During operation of filter 1000, an input signal from input node 1004 is communicated to noninverting input node 1010a of variable transconductance amplifier 1010. Where variable transconductance amplifier 1010 is connected with negative feedback and biased with an $I_{bias}$ control current, transconductance amplifier 1010 will exhibit an effective resistance. The signal output from node 1010d of variable transconductance amplifier 1010 is then exposed to shunt capacitor 1006, and the filtered signal is communicated to filter output node 1008.

By varying the current $I_{bias}$ applied to node 1010c of transconductance amplifier 1010, the effective resistance ($R_{eff}$) of filter 1000, and hence the frequency allowed to pass through filter 1000, may readily be adjusted. This effective resistance will conform to variations in internal resistances within the chip over both process and temperature. The frequency of filter 1000 will obey the following equation:

$$Freq=1/(2\pi R_{eff}C) \quad (IV)$$

In equation (IV), the values for $R_{eff}$ and C are internally defined within the chip. Thus, when a VCO employing transconductance amplifiers in both the positive and negative feedback loops (as shown in FIG. 6) is used in conjunction with a frequency filter employing a variable transconductance amplifier to control effective resistance (as shown in FIG. 10), the frequency responses of the VCO and the filter will track one another.

Figure 11:
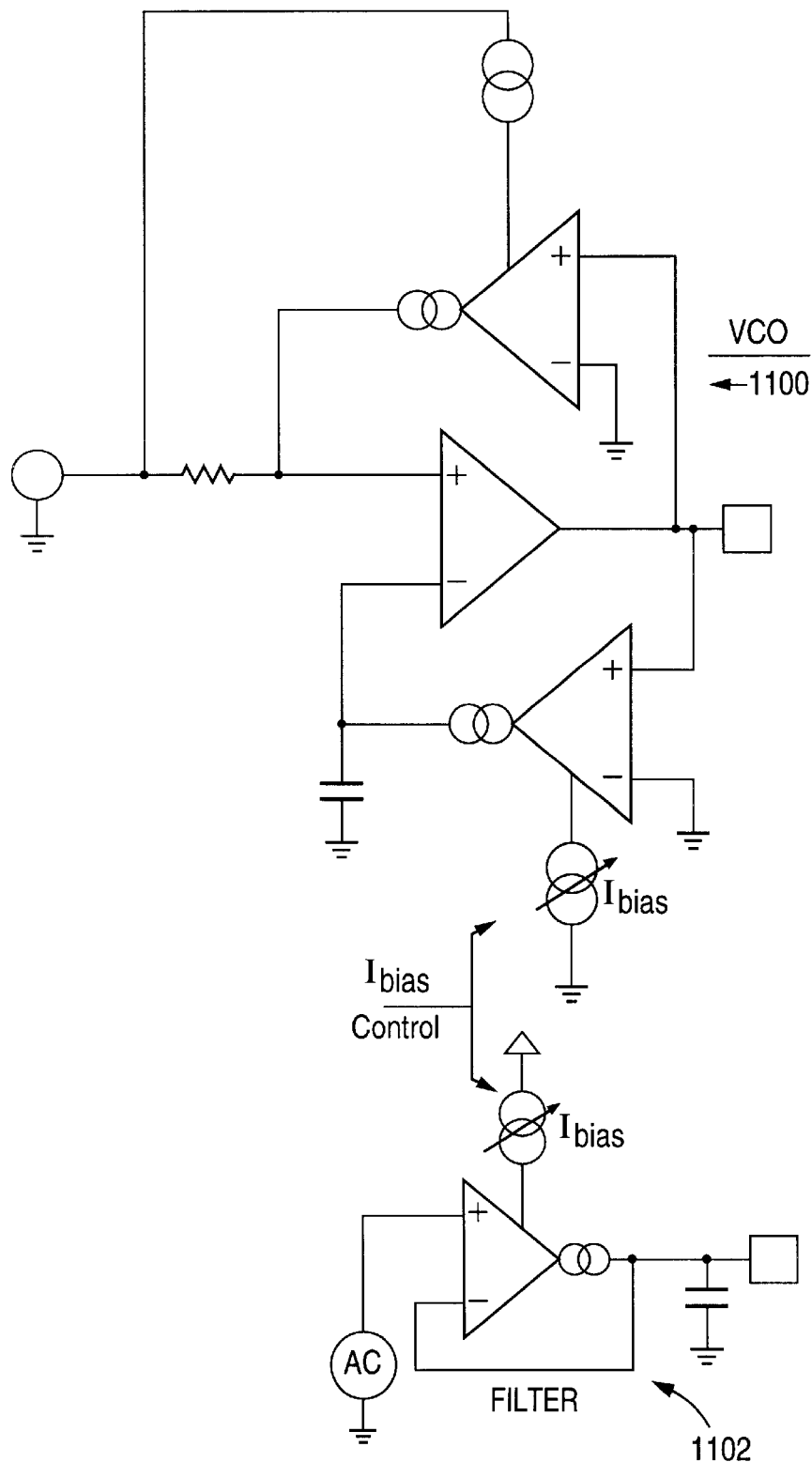
FIG. 11 shows a schematic diagram of a circuit exerting a control bias over a voltage controlled oscillator and a filter in accordance with another embodiment of the present invention.

Accordingly, FIG. 11 shows a schematic diagram of a circuit simultaneously exerting a control current bias ($I_{bias}$) over a voltage controlled oscillator and a filter in accordance with one embodiment of the present invention. Application of $I_{bias}$ to the transconductance amplifiers present in VCO 1100 and filter 1102 eliminates the impact of variations in the absolute values of capacitances and resistances due to inherent uncertainties in doping during the fabrication process.

The present invention offers several important advantages over existing filter designs. Most importantly, the filter in accordance with the present invention does not require a clock signal from an external reference in order to operate.

Conventional switched capacitor filters permit the user to overcome inherent variations in internal resistance and capacitance by defining the frequency response of the filter utilizing an external clock signal. With a filter in accordance with the present invention however, the frequency response of the filter can be defined to an equivalent accuracy without relying upon an external clock signal.

In addition, the present invention avoids the need to perform any pre-filtering. Specifically, because switching at a regular frequency is not required by the present invention, input signals having a frequency of $F<2F_s$ need not be excluded to prevent the occurrence of a false filtered signal.

Moreover, the filter in accordance with the present invention can function while drawing only DC current. If all components of the filter are fabricated to operate differentially, no "digital" supply current spikes will arise that could potentially interfere with the reliable functioning of the device. This can be accomplished by using constant current balanced differential circuitry, such that every change in voltage and current is accompanied by a corresponding opposite change.

4. Resonant Circuit

Figure 12:
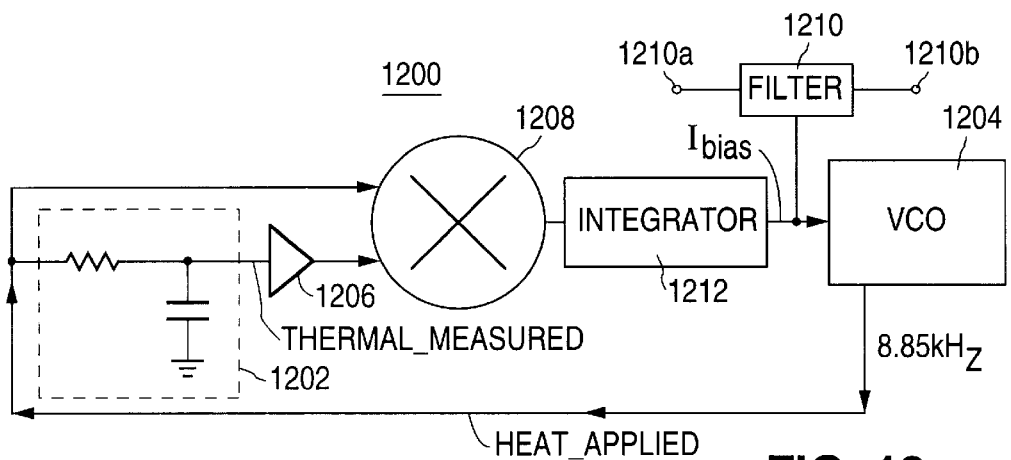
FIG. 12 shows a schematic diagram of a simple closed resonant analog oscillator circuit in accordance with still another embodiment of the present invention.

FIG. 12 shows a schematic diagram of a first embodiment of a resonant oscillator circuit 1200 in accordance with the present invention. As previously described in connection with FIGS. 3 and 4A, closed circuit 1200 includes thermal RC network 1202 receiving the "HEAT_APPLIED" signal from voltage controlled oscillator 1204. Thermal RC network 1202 in turn transmits a time-delayed "THERMAL_MEASURED" signal to amplifier 1206. Amplifier 1206 in turn transmits the amplified measured signal to multiplier 1208,-which determines the phase difference with the original "HEAT_APPLIED" signal. After filtration and transconductance amplification by integrator 1212, an $I_{bias}$ current control signal corresponding to this phase difference is provided to VCO 1204 and to filter 1210 having input node 1210a and output node 1210b.

Using the six PNP transistor lateral array thermal RC network shown in FIG. 4A, the free-running frequency of the detection circuit of FIG. 4A was 5.7 kHz. Once the circuit loop shown in FIG. 12 was completed, the frequency remained stable at 8.85 kHz.

The change in τ resulting from implementation of the same lateral array of PNP bipolar transistors in different silicon die was measured utilizing a frequency counter. For a simple implementation of the circuit, the frequency shift was about ±0.2%. This confirms that τ varies little between different silicon chips.

Given an increase in the ambient temperature of the circuit from room temperature to about 100° C., the frequency increased about 0.3%. A decrease in ambient temperature from room temperature to about −40° C. produced about the same change in the value of τ. Taken together, these measurements indicate that the temperature coefficient of the circuit is both consistent and relatively small.

Figure 13:
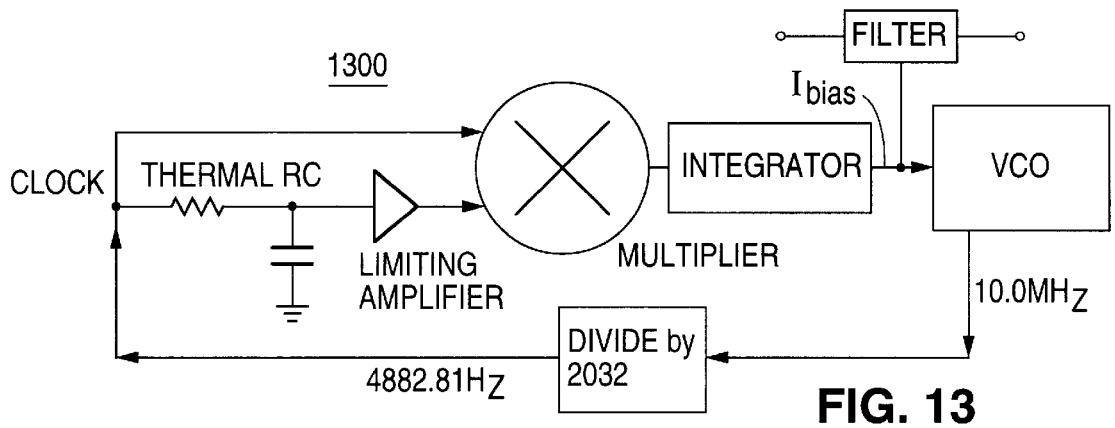
FIG. 13 shows a schematic diagram of an oscillator circuit having a constant frequency of 10 MHz, in accordance with yet another embodiment of the present invention.

A standard frequency for many microprocessors is 10 MHz. Therefore, FIG. 13 shows a schematic diagram of an oscillator circuit 1300 in accordance with the present invention having a constant frequency of 10 MHz. As discussed above, the time constant τ of a given thermal RC network could be varied to achieve a phase shift of a specific magnitude simply by adjusting spacing between the laterally arrayed transistors. In the circuit shown in FIG. 13, flip flops were required to divide down (by a factor of 2032) the 10 MHz VCO clock signal to 4882.81 Hz.

Figure 14A:
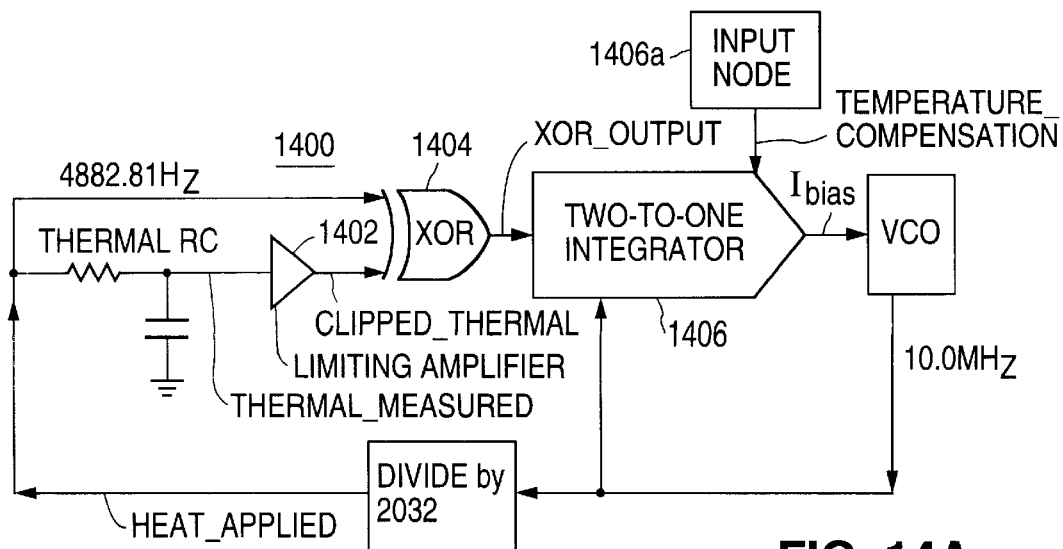
FIG. 14A shows a schematic diagram of a near-digital oscillator circuit having a constant frequency of 10 MHz in accordance with further still another embodiment of the present invention.

While the embodiments of the present invention shown in FIGS. 12 and 13 employ analog frequency detection and regulation, this function can also be performed utilizing digital circuit components. FIG. 14A shows a schematic diagram of a near-digital oscillator circuit 1400 having a frequency of 10 MHz in accordance with the present invention.

In the near-digital embodiment shown in FIG. 14A, the step of limiting the THERMAL_MEASURED waveform is still performed by an analog limiting amplifier 1402. However, this analog limiting function could be accomplished utilizing only CMOS structures, with standard digital CMOS inverters operating in their "linear" region.

In FIG. 14A, the analog multiplier has been replaced by an "exclusive or" (XOR) gate 1404. XOR gate 1404 receives the clock (HEAT_APPLIED) signal from the VCO and the CLIPPED_THERMAL signal from the analog limiting amplifier. In response, XOR gate 1404 produces an XOR_OUTPUT comparison signal.

The two-to-one integrator 1406 receives the XOR_OUTPUT signal. Integrator 1406 also includes a second input node 1406*a* for receiving a digital TEMPERATURE_COMPENSATION signal as an input. The purpose of the TEMPERATURE_COMPENSATION signal is to adjust the frequency of the output to compensate for changes in $\tau$ attributable to variation in ambient temperature.

As shown above in Equations (I) and (II) and in FIG. 2, the thermal resistance and capacitance of silicon varies somewhat with temperature. Thus, changes in thermal resistance and capacitance due to variations in ambient temperature would affect the time constant $\tau$ exhibited by the RC network. This change in $\tau$ with temperature would in turn affect the frequency of the circuit. Therefore, an input to the integrator could be used to compensate for the temperature dependence of thermal resistance and thermal capacitance.

Figure 14B:
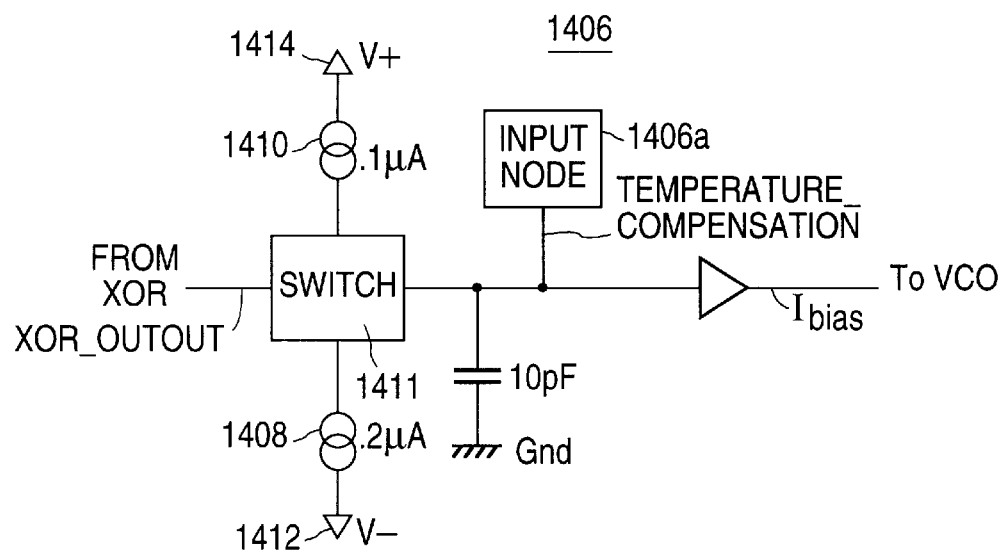
FIG. 14B shows a circuit schematic of the two-to-one integrator of the oscillator circuit shown in FIG. 14A.

FIG. 14B shows a circuit schematic of a two-to-one integrator 1406 that may be used in the present invention. Two-to-one integrator 1406 includes constant current sources 1408 and 1410. Constant current source 1408 is connected to low voltage rail 1412. Constant current source 1410 is connected to high voltage rail 1414.

Input from current sources 1408 and 1410 is controlled by switch 1411. Switch 1411 receives input from current sources 1408 and 1410, as well as the XOR_OUTPUT voltage from the XOR gate. Switch 1411 selects between current sources 1408 and 1410 to provide an output based the XOR_OUTPUT voltage.

The resulting output from switch 1411 is then supplemented by the TEMPERATURE_COMPENSATION input from node 1406*a*. The combined signal is then amplified and communicated to the VCO.

Figure 14C:
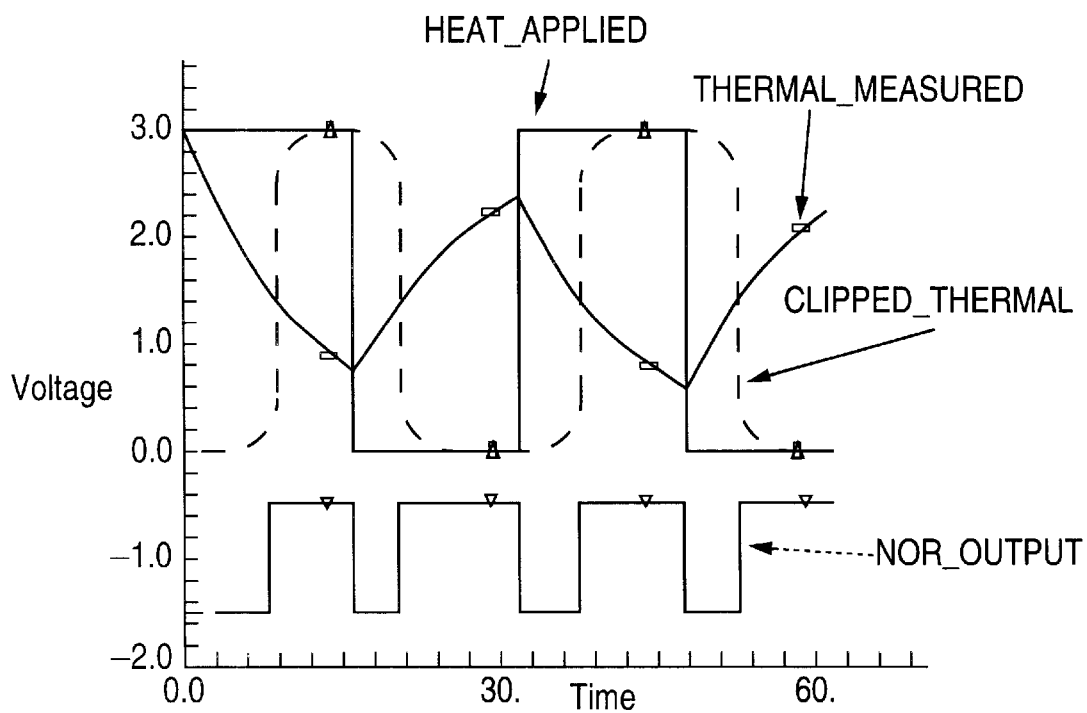
FIG. 14C plots waveforms for the HEAT_APPLIED voltage (the clock signal), the THERMAL_MEASURED voltage, the CLIPPED_THERMAL voltage, and the XOR_OUTPUT voltage of the oscillator circuit shown in FIG. 14A.

FIG. 14C plots waveforms for the HEAT_APPLIED voltage (the clock signal), the THERMAL_MEASURED voltage, the CLIPPED_THERMAL voltage, and the XOR_OUTPUT voltage of the oscillator circuit shown in FIG. 14A.

The present invention offers several important advantages over existing frequency detection and correction configurations. For example, until now it was not possible to completely integrate a frequency detection and monitoring system on a single die. Often, an external crystal or resonator component was required, at considerable added expense.

However, with the present invention all of the functional blocks of the circuit are standard components of integrated circuits. Amplifiers, bipolar transistors, XOR logic gates, integrators, and other elements of the circuit can readily be manufactured and incorporated into the integrated circuit.

The present invention also avoids the problem posed by conventional electronic RC networks that are unable to exhibit sufficiently consistent electrical resistances and capacitances to provide a dependable frequency reference.

In the present invention, the crucial thermal properties of silicon should remain substantially constant over a variety of manufacturing conditions. This is because highly-ordered single crystal silicon created during standard fabrication processes should also exhibit highly consistent thermal resistance and capacitance.

The present invention is designed to minimize introduction of unwanted variation into the output of the circuit due to changes in ambient temperature. By sampling the waveform generated by the heat pulse from two points in the thermal RC network, any global increase in temperature will not be reflected in a change in the time constant and a corresponding change in phase shift.

Moreover, the circuit provides for an input to compensate for changes in thermal resistance and thermal capacitance of single-crystal silicon attributable to changes in ambient temperature.

While the frequency detection and correction function provided by the present invention does result in a somewhat larger circuit, the overall size of this circuit is still quite small. The frequency detection and correction function provided by the present invention should easily fit into the smallest three lead package available. Moreover, the total expense of the device should be dominated by package costs, because a constant 10 MHz frequency output should cost little to test.

Although the thermal frequency reference in accordance with the present invention has been described in connection with several specific embodiments, it should not be unduly limited to such embodiments. Various other modifications and alterations in the structure and method of operation of this invention will be apparent to those skilled in the art without departing from the scope of the present invention.

For example, FIGS. 3 and 4A illustrate the use of arrayed PNP bipolar transistors to detect propagation of the heat pulse through the single crystal silicon. Changes in the $V_{be}$ of these transistors indicates the passage of the heat pulse. However, the present invention is not limited to this specific form of heat detection. Changes in the $V_{be}$ of NPN bipolar transistors, or even changes in the voltage of any forward-biased PN junction, could also be used to detect a change in temperature caused by a heat pulse.

Moreover, FIGS. 14A–14B describe the application of a TEMPERATURE_COMPENSATION voltage to input node 1406*a* of integrator 1406, in order to compensate for variations in ambient temperature. However, another potential application would be to utilize this node to create a "spread spectrum" effect.

The "spread spectrum" effect involves intentional FM modulation of the clock signal of central processing unit. This modulation is performed so that if the clock signal happens to fall within the frequency range of an unrelated RF input, the modulation creates a "spread spectrum" which is interpreted by the RF input as noise, and ignored. Modulation of the clock signal giving rise to the "spread spectrum" can be accomplished by applying a random input to the system via the input node of the integrator.

In addition to compensating for changes in ambient temperature and inducing random modulation, the input node of the integrator may also be utilized as part of a phase lock loop (PLL) feature. Specifically, the clock signal in accordance with the present invention may be synchronized with an external reference signal utilizing a PLL configuration. In such an application, the external reference signal could be incorporated into the oscillation circuit through the input node of the integrator. Thus, effective bandwidth of the filter could also be linked to an externally-supplied signal.

The present invention has so far been discussed exclusively in relation to a circuit for maintaining a constant frequency output of the oscillator. However, the underlying physical principles could also be utilized to create a temperature sensor.

To understand this, recall again that the relation between ambient temperature and thermal resistance and thermal capacitance of silicon is set forth in Equation (I) and FIG. 2, respectively. Recall also that the output frequency of circuit 1400 is independent of the frequency, amplitude, and duty cycle of the original VCO signal.

Thus in FIG. 14A, where no additional voltage is input at second node 140 6a of integrator 1406, the frequency of the output of the circuit 1400 could be monitored for changes. Any variation in output would be attributable only to a change in the time delay τ of the thermal RC network, and thus to variation in thermal resistance and capacitance of silicon due to changes in ambient temperature. In this manner, the present invention could also be utilized as a temperature detector such that changes in output frequency of the circuit could be monitored and calibrated to indicate changes in ambient temperature.

Therefore, a method for measuring temperature in accordance with one embodiment of the present invention comprises the steps of providing a semiconductor workpiece having a thermal resistance and a thermal capacitance, applying a clock signal from a voltage controlled oscillator to a heat source positioned at a first point within the semiconductor workpiece, the heat source generating a heat pulse in response to the clock signal, providing a thermal RC network within the silicon having a thermal time constant, the thermal RC network receiving the heat pulse and producing a voltage signal based upon the thermal time constant, amplifying and limiting the voltage signal to produce a clipped output voltage, comparing the clock signal and the clipped output voltage to produce a feedback voltage corresponding to a phase difference between the clock signal and the clipped output voltage, and correlating the feedback voltage to variation in the thermal resistance and the thermal capacitance of the semiconductor workpiece caused by a change in ambient temperature.

Finally, one method of calibrating the frequency of the VCO shown in FIG. 6 would be to use the VCO in a phase lock loop (PLL). If a PLL is employed to adjust the $I_{bias}$ control current to track a thermal frequency reference, the frequency reference can be corrected along with that of the VCO.

Thus, if internal resistance is 20% too low due to uncontrollable processing variations, both the VCO and filter would operate with frequency that is 20% too fast. Thus, decreasing bias current to both the VCO and the filter by 20% would reduce the frequency response by 20%.

Similarly, a PLL can also be utilized to calibrate a filter to an external frequency reference. However, a clock signal must still be provided by a crystal or other external component.

It is intended that the following claims define the scope of the present invention, and that the methods and structures within the scope of these claims and their equivalents be covered hereby.

What is claimed is:

1. An apparatus for producing an output signal having a substantially constant frequency, the apparatus comprising:
   a voltage controlled oscillator configured to receive a control bias current signal and to produce a clock signal having a first frequency;
   a semiconductor workpiece having a thermal resistance and a thermal capacitance;
   a heat source positioned at a first point within the semiconductor workpiece, the heat source configured to receive the clock signal and generate a heat pulse in the semiconductor workpiece;
   a thermal network formed within the semiconductor workpiece and having a thermal time constant, the thermal network configured to receive the heat pulse and produce a voltage signal based upon the thermal time constant;
   a limiting amplifier configured to receive, amplify, and limit the voltage signal to produce a clipped output voltage; and
   a comparator configured to receive the clock signal and the clipped output voltage and produce the control bias current signal corresponding to a phase difference between the clock signal and the clipped output voltage, wherein the voltage controlled oscillator alters the first frequency of the clock signal in response to the control bias current signal.

2. The apparatus according to claim 1 wherein:
   the thermal network comprises a first PN junction formed in the semiconductor workpiece proximate to the first point, and a second PN junction formed in the semiconductor workpiece distal from the first point; and
   the limiting amplifier is configured to receive a first voltage signal from the first PN junction and a second voltage signal from the second PN junction, and the limiting amplifier is configured to produce the clipped output voltage reflecting a difference between the first and second voltage signals.

3. The apparatus according to claim 2 wherein the first PN junction is a base-emitter junction of a first PNP bipolar transistor and the second PN junction is a base-emitter junction of a second PNP bipolar transistor.

4. The apparatus according to claim 2 wherein the first PN junction is a base-emitter junction of a first NPN bipolar transistor and the second PN junction is a base-emitter junction of a second NPN bipolar transistor.

5. The apparatus according to claim 1 further comprising a divider circuit structure configured to receive the clock signal from the voltage controlled oscillator and produce a divided clock signal to the heat source.

6. The apparatus according to claim 1 wherein the comparator comprises:
   an XOR gate configured to receive the clock signal and the clipped output voltage, and produce a comparison signal; and
   an integrator configured to receive the comparison signal at a first input node and generate a control bias current from the comparison signal.

7. The apparatus according to claim 6 wherein the integrator is configured to receive a correction voltage at a second input node, the correction voltage correcting the control bias current signal for variations in the thermal resistance and the thermal capacitance of the semiconductor workpiece attributable to changes in ambient temperature.

8. The apparatus according to claim 6 wherein the integrator is configured to receive a modulated voltage signal at a second input node, the modulated voltage signal causing the control bias current signal to exhibit a spread spectrum.

9. The apparatus according to claim 6 wherein the integrator is configured to receive an external reference signal at a second input node, the external reference signal having a frequency and causing the control bias current signal to synchronize with the frequency of the external reference signal.

10. A method for maintaining constant frequency output of a voltage controlled oscillator comprising the steps of:

applying a clock signal from a voltage controlled oscillator to a first point of a semiconductor workpiece;

generating a heat pulse at the first point of the semiconductor workpiece based upon the clock signal;

producing a voltage signal based upon a thermal time constant of a thermal network formed within the semiconductor workpiece;

amplifying the voltage signal;

limiting the amplified voltage signal to produce a clipped output voltage;

comparing the clock signal and the clipped output voltage to produce a control bias current corresponding to a phase difference between the clock signal and the clipped output voltage; and altering the frequency of the clock signal in response to the control bias current.

11. The method according to claim 10 wherein the step of producing a voltage signal comprises:

sensing a first voltage of a first PN junction positioned at a second point of the semiconductor workpiece proximate to the first point;

sensing a second voltage of a second PN junction positioned at a third point of the semiconductor workpiece distal from the first point; and producing a voltage signal reflecting a difference between the first voltage and the second voltage.

12. The method according to claim 11 wherein:

the step of sensing a first voltage comprises sensing a first voltage at a base-emitter junction of a first PNP bipolar transistor; and the step of sensing a second voltage comprises sensing a second voltage at a base-emitter junction of a second PNP bipolar transistor.

13. The method according to claim 11 wherein:

the step of sensing a first voltage comprises sensing a first voltage at a base-emitter junction of a first NPN bipolar transistor; and the step of sensing a second voltage comprises sensing a second voltage at a base-emitter junction of a second NPN bipolar transistor.

14. The method according to claim 10 further comprising the steps of:

dividing the clock signal produced by the voltage controlled oscillator; and applying the divided clock signal at the first point.

15. The method according to claim 10 wherein the step of comparing the clipped output voltage and the clock signal comprises communicating the clipped output voltage and the clock signal to an analog multiplier.

16. The method according to claim 10 wherein the step of comparing the clipped output voltage to the clock signal comprises communicating the clipped output voltage and the clock signal to a digital XOR gate to produce a comparison voltage.

17. The method according to claim 16 further comprising the step of adding the comparison voltage to an input voltage to produce the control bias current.

18. The method according to claim 17 wherein the step of adding the comparison voltage to an input voltage comprises adding the comparison voltage to a temperature compensation voltage to correct the control bias current for variations in thermal resistance and thermal capacitance of the semiconductor workpiece attributable to changes in ambient temperature.

19. The method according to claim 17 wherein the step of adding the comparison voltage to an input voltage comprises adding the comparison voltage to a modulated voltage signal to cause the control bias current to exhibit a spread spectrum.

20. The method according to claim 17 wherein the step of adding the comparison voltage to an input voltage comprises adding the comparison voltage to an external reference signal having a frequency, the external reference signal causing the control bias current to synchronize with the frequency of the external reference signal.

21. A method for measuring temperature comprising:

applying a clock signal from a voltage controlled oscillator to a first point of a semiconductor workpiece;

generating a heat pulse at the first point of the semiconductor workpiece based upon the clock signal;

producing a voltage signal based upon a thermal time constant of a thermal network formed within the semiconductor workpiece;

amplifying the voltage signal;

limiting the voltage signal to produce a clipped output voltage;

comparing the clock signal and the clipped output voltage to produce a control bias current corresponding to a phase difference between the clock signal and the clipped output voltage; and correlating the control bias current to variation in thermal resistance and thermal capacitance of the semiconductor workpiece caused by changes in ambient temperature.

22. The method according to claim 21 wherein the step of producing a voltage signal comprises:

sensing a first voltage of a first PN junction positioned at a second point of the semiconductor workpiece proximate to the first point;

sensing a second voltage of a second PN junction positioned at a third point of the semiconductor workpiece distal from the first point; and producing a voltage signal reflecting a difference between the first voltage and the second voltage.

23. The method according to claim 22 wherein:

the step of sensing a first voltage comprises sensing a first voltage at a base-emitter junction of a first PNP bipolar transistor; and the step of sensing a second voltage comprises sensing a second voltage at a base-emitter junction of a second PNP bipolar transistor.

24. The method according to claim 22 wherein:

the step of sensing a first voltage includes sensing a first voltage at a base-emitter junction of a first NPN bipolar transistor; and the step of sensing a second voltage includes sensing a second voltage at a base-emitter junction of a second NPN bipolar transistor.

25. An apparatus including a voltage controlled oscillator comprising:

an oscillator input node configured to receive an input voltage signal;

an operational amplifier having a noninverting input node, an inverting input node, and an oscillator output node, the noninverting input node of the operational amplifier configured to receive the input voltage signal from the oscillator input node, and the oscillator output node configured to produce a clock signal;

a positive feedback loop between the oscillator output node and the noninverting input node, the positive feedback loop including a fixed transconductance amplifier configured to receive a bias current; and a negative feedback loop between the oscillator output node and the inverting input node, the negative feedback loop including a variable transconductance amplifier and a shunt capacitor, the variable transconductance amplifier configured to receive a control bias current which varies relative to the bias current.

26. The apparatus according to claim 25 wherein the fixed transconductance amplifier includes a noninverting input node, an inverting input node, a control current input node, and an output node, the noninverting input node of the fixed transconductance amplifier in electrical communication with the oscillator output node, the inverting input node of the fixed transconductance amplifier in electrical communication with ground, the control current input node of the fixed transconductance amplifier in electrical communication with the bias current, and the output node in electrical communication with the noninverting input node of the fixed transconductance amplifier.

27. The apparatus according to claim 25 wherein the variable transconductance amplifier comprises a noninverting input node, an inverting input node, a control current input node, and an output node, the noninverting input node of the variable transconductance amplifier in electrical communication with the oscillator output node, the inverting input node of the variable transconductance amplifier in electrical communication with ground, the control current input node of the variable transconductance amplifier in electrical communication with the control bias current, and the output node of the variable transconductance amplifier in electrical communication with a shunt capacitor and the inverting input node of the operational amplifier.

28. An oscillator circuit comprising:
   a semiconductor workpiece having a thermal resistance and a thermal capacitance;
   a voltage controlled oscillator formed in the semiconductor workpiece and including,
      an oscillator input node configured to receive an input voltage signal,
      an operational amplifier having a noninverting input node, an inverting input node, and an oscillator output node, the noninverting input node of the operational amplifier configured to receive the input voltage signal from the oscillator input node, and the oscillator output node configured to produce a clock signal having a first frequency,
      a positive feedback loop between the oscillator output node and the noninverting input node, the positive feedback loop including a fixed transconductance amplifier configured to receive a first control bias current, and
      a negative feedback loop between the oscillator output node and the inverting input node, the negative feedback loop including a variable transconductance amplifier and a first shunt capacitor, the variable transconductance amplifier configured to receive a second control bias current which varies relative to the first control bias current; and
   a thermal frequency reference including,
      a heat source positioned at a first point within the semiconductor workpiece, the heat source configured to receive the clock signal and in response to generate a heat pulse in the semiconductor workpiece,
      a thermal network formed within the silicon and having a thermal time constant, the thermal network configured to receive the heat pulse and produce a voltage signal based upon the thermal time constant,
      a limiting amplifier configured to receive, amplify, and limit the voltage signal and produce a clipped output voltage, and
      a comparator configured to receive the clock signal and the clipped output voltage and produce the second control bias current signal corresponding to a phase difference between the clock signal and the clipped output voltage, whereby the voltage controlled oscillator alters the first frequency of the clock signal in response to the second control bias current signal emitted by the thermal frequency reference.

29. An oscillator circuit according to claim 28 further comprising a filter having a filter input node, a third transconductance amplifier, a shunt capacitor, and an output node, the third transconductance amplifier configured to receive an input voltage signal from the filter input node and the second control bias current from the thermal frequency reference.

30. An oscillator circuit according to claim 29 wherein:
   the first transconductance amplifier is an NPN bipolar transistor; and
   the second transconductance amplifier is an NPN bipolar transistor having an emitter in electrical communication with the thermal frequency reference.

31. An oscillator circuit according to claim 29 wherein:
   the first transconductance amplifier is a PNP bipolar transistor; and
   the second transconductance amplifier is a PNP bipolar transistor having an emitter in electrical communication with the thermal frequency reference.

32. A method of calibrating a filter comprising the steps of:
   conveying a variable control bias current signal to a current input node of a first variable transconductance amplifier forming a resistive element of a filter, the first variable transconductance amplifier including a noninverting input node and positioned in series with a shunt capacitor, an output of the variable transconductance amplifier in negative feedback with an inverting input node of the variable transconductance amplifier, whereby the variable control bias current signal calibrates a bandwidth of the filter; and
   conveying the variable control bias current signal to a current input node of a second variable transconductance amplifier forming a resistive element of a voltage controlled oscillator, whereby the variable control bias current signal calibrates the bandwidth of the filter with an output frequency of the voltage controlled oscillator.

33. The method according to claim 32 further comprising the steps of:
   applying a clock signal from the voltage controlled oscillator to a first point of a semiconductor workpiece;
   generating a heat pulse at the first point of the semiconductor workpiece based upon the clock signal;
   producing a voltage signal based upon a thermal time constant of a thermal network formed within the semiconductor workpiece;
   amplifying the voltage signal;
   limiting the amplified voltage signal to produce a clipped output voltage; and
   comparing the clock signal and the clipped output voltage to produce the variable control bias current signal, the variable control bias current signal corresponding to a phase difference between the clock signal and the clipped output voltage.

* * * * *